United States Patent
Matsumoto et al.

(10) Patent No.: US 11,032,958 B2
(45) Date of Patent: *Jun. 8, 2021

(54) MOUNTING WORK MACHINE

(71) Applicant: FUJI CORPORATION, Chiryu (JP)

(72) Inventors: Toru Matsumoto, Okazaki (JP); Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/737,497

(22) Filed: Jan. 8, 2020

(65) Prior Publication Data
US 2020/0146193 A1    May 7, 2020

Related U.S. Application Data

(63) Continuation of application No. 16/230,963, filed on Dec. 21, 2018, now Pat. No. 10,575,450, which is a continuation of application No. 15/554,386, filed as application No. PCT/JP2015/056161 on Mar. 3, 2015, now Pat. No. 10,206,318.

(51) Int. Cl.
*H05K 13/02*     (2006.01)
*H05K 13/04*     (2006.01)
*H05K 13/08*     (2006.01)

(52) U.S. Cl.
CPC ......... *H05K 13/022* (2013.01); *H05K 13/028* (2013.01); *H05K 13/043* (2013.01); *H05K 13/0452* (2013.01); *H05K 13/0495* (2013.01); *H05K 13/081* (2018.08); *H05K 13/086* (2018.08)

(58) Field of Classification Search
None
See application file for complete search history.

(56) References Cited

U.S. PATENT DOCUMENTS

| | | |
|---|---|---|
| 5,687,831 A | 11/1997 | Carlisle |
| 6,056,108 A | 5/2000 | Buchi |
| 7,028,829 B2 | 4/2006 | Buchi |
| 8,955,666 B2 | 2/2015 | Nakajima |
| 9,949,417 B2 | 4/2018 | Morikawa |

(Continued)

FOREIGN PATENT DOCUMENTS

JP    10-202569 A    8/1998

OTHER PUBLICATIONS

International Search Report issued in PCT/JP2015/056161 dated May 26, 2015.

*Primary Examiner* — William R Harp
(74) *Attorney, Agent, or Firm* — Oblon, McClelland, Maier & Neustadt, L.L.P.

(57) ABSTRACT

A component supply device including a component storage device that stores a plurality of components, a component support member on which the components from the component storage device are dispersed, and a component return device that returns the components on the component support member to the component storage device, is provided. In a case where the necessary number of components exceeds the number of holdable components, return work of the components to the component container and dispersal work of the components to the component support section are carried out prior to holding the components from the component support section by the component holding tool.

5 Claims, 12 Drawing Sheets

(56) References Cited

U.S. PATENT DOCUMENTS

| | | |
|---|---|---|
| 10,206,318 B2 * | 2/2019 | Matsumoto .......... H05K 13/043 |
| 10,575,450 B2 * | 2/2020 | Matsumoto .......... H05K 13/043 |
| 2017/0196131 A1 | 7/2017 | Ishikawa |
| 2017/0238448 A1 | 8/2017 | Iwaki |
| 2017/0273226 A1 | 9/2017 | Iwaki |
| 2017/0341874 A1 | 11/2017 | Matsumoto |
| 2018/0035581 A1 | 2/2018 | Matsumoto |

* cited by examiner

MOUNTING WORK MACHINE

CROSS-REFERENCE TO RELATED APPLICATIONS

This application is a continuation of U.S. application Ser. No. 16/230,963 filed Dec. 21, 2018, which is a continuation of U.S. application Ser. No. 15/554,386 filed Aug. 29, 2017 (now U.S. Pat. No. 10,206,318 issued Feb. 12, 2019), the entire contents of each of which is incorporated herein by reference. U.S. application Ser. No. 15/554,386 is a 371 of International Application No. PCT/JP2015/056161 filed Mar. 3, 2015.

TECHNICAL FIELD

The present disclosure relates to a mounting work machine that performs mounting work of components on a board.

BACKGROUND ART

In a component supply device that has a component support section that supports multiple components in a dispersed state, the components are dispersed from a component container in the component support section, and components with a holdable posture are held by a component holding tool out of the components that are supported in the component support section. Next, supply of the components is carried out by placing the components that are held in the component holding tool in an ordered state in a placement section. Then, the mounting work on the board is carried out using the supplied components in the mounting work machine. In addition, the component supply device has a component return device that returns the components from the component support section to the component container. Therefore, for example, the components are returned from the component support section to the component container, and the components that are returned to the component container are redispersed to the component support section in a case where there is no holdable posture component by the component holding tool in the component support section. Thereby, the components from the component support section are held by the component holding tool by the components with a posture that is holdable by the component holding tool being redispersed in the component support section. An example of a component supply device with such a structure is described in the following patent literature.

PTL 1: JP-A-10-202569

SUMMARY

According to the component supply device described in the patent literature above, it is possible to supply a large number of components from the component supply device by carrying out return work of the component to the component container and dispersal work on the component support section of the components that are returned to the component container. However, there is a concern that supply of the components is delayed and a cycle time of the mounting work by the mounting work machine is reduced since time is necessary to a certain extent in return work of the components to the component container and dispersal work of the components to the component support section. The present disclosure is made in consideration of such circumstances, and addresses a problem of preventing a reduction of the cycle time of the mounting work of the components that are supplied to the component supply device.

In order to solve the problem described above, a mounting work machine that performs mounting work of components on a board described in the present disclosure includes a component supply device that has (A) a component storage device that stores a plurality of components, (B) a component support section that supports the components in a dispersed state in which the components are dispersed from the component storage device, (C) a component return device that returns the components that are in a dispersed state in the component support section to the component storage device, (D) a first component holding tool that holds the components that are supported in the component support section, (E) an imaging device that images the components that are supported in the component support section, (F) a placement section for placing the components that are held in the first component holding tool in an ordered state, and (G) a control device, and supplies the components in an ordered state in the placement section, and a component mounting device that has a second component holding tool that holds the components that are placed on the placement section and mounts the components that are held in the second component holding tool on the board, in which the control device includes a component number acquisition section that acquires a necessary number of components that is a number of components that are necessary during mounting work in the mounting work machine, a component number calculating section that calculates a number of holdable components that is a number of components that are holdable from the component support section by the first component holding tool based on captured image data that is captured by the imaging device, a first determination section that determines whether or not the necessary number of components that are acquired by the component number acquisition section exceeds the number of holdable components that are calculated by the component number calculating section, and a component dispersing section that redisperses the components from the component storage device to the component support section prior to holding the components from the component support section by the first component holding tool and after the components in a state of being dispersed in the component support section are returned to the component storage device through the operation of the component return device on condition that it is determined that the necessary number of components exceeds the number of holdable components by the first determination section.

The mounting work machine described in the present disclosure determines whether or not the necessary number of components that is the number of components that are necessary during mounting work exceeds the number of holdable components that is a number of components that are holdable from the component support section by the component holding tool. Then, as a condition of determining that the necessary number of components exceeds the number of holdable components, by carrying out return work of the components to the component container and dispersal work of the components in the component support section prior to holding the components from the component support section by the component holding tool. Thereby, it is possible to carry out return work of the components to the component container and dispersal work of components of the component support section with good timing, and it is possible to prevent reduction of the cycle time of mounting work by the mounting work machine.

DESCRIPTION OF EMBODIMENTS

Hereinafter, detailed description will be given of the example of the present disclosure with reference to the drawings as a mode for carrying out the present disclosure.
<Configuration of Component Mounting Machine>

Figure 1:
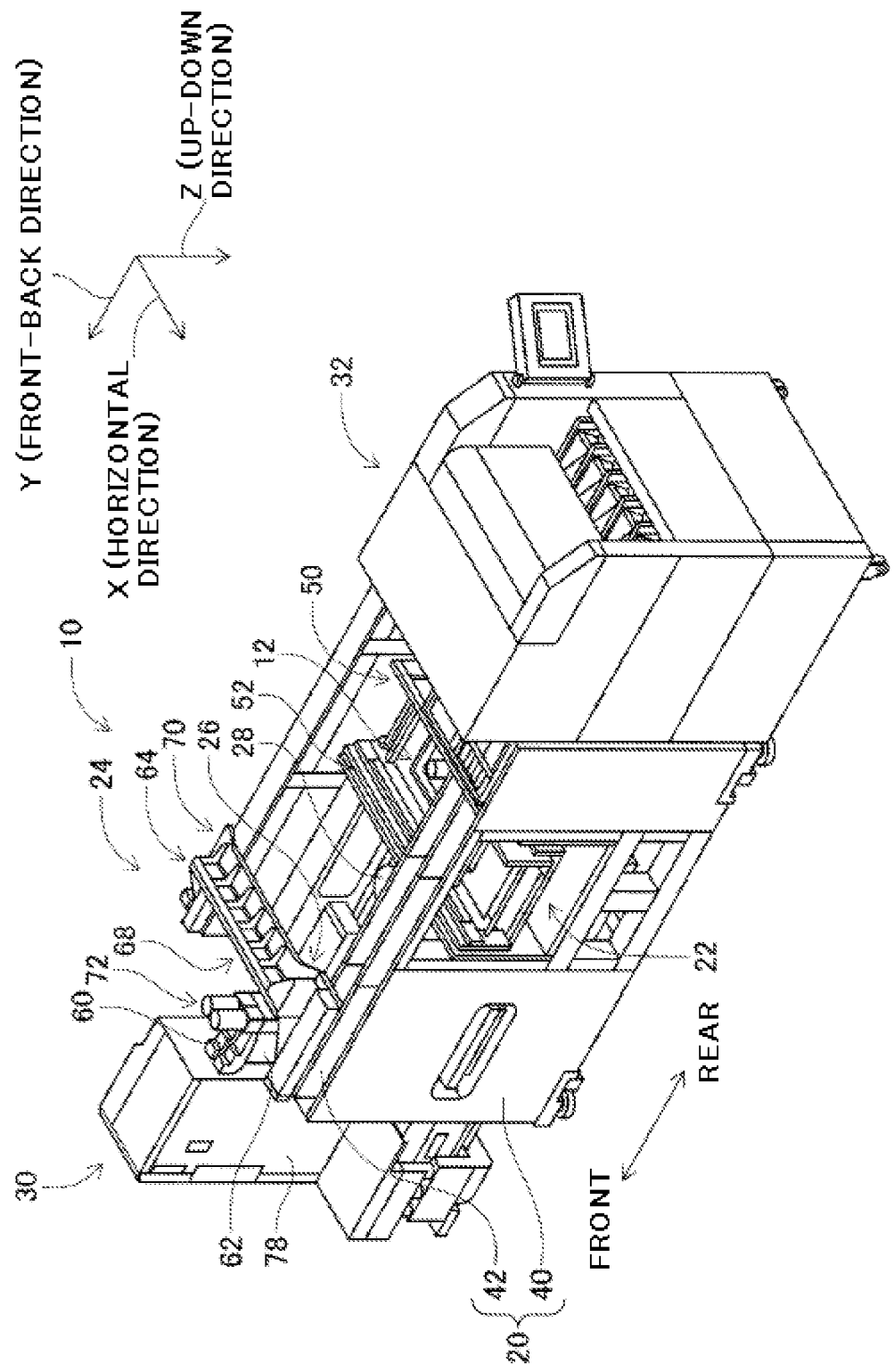
FIG. 1 is a perspective view illustrating a component mounting machine.

FIG. 1 illustrates a component mounting machine 10. The component mounting machine 10 is a device for executing mounting work of components onto a circuit substrate 12. The component mounting machine 10 is provided with a device main body 20, a substrate conveyance and holding device 22, a component mounting device 24, imaging devices 26 and 28, a component supply device 30, a bulk component supply device 32, and a control device 34 (refer to FIG. 8). Examples of the circuit substrate 12 include a circuit board, a three-dimensional structure substrate, and the like, and examples of the circuit board include a printed wiring board, a printed circuit board, and the like.

The device main body 20 is formed of a frame section 40, and a beam section 42 which bridges over the frame section 40. The substrate conveyance and holding device 22 is arranged in the middle of the front-back direction of the frame section 40, and includes a conveyance device 50 and a clamping device 52. The conveyance device 50 is a device which conveys the circuit substrate 12, and the clamping device 52 is a device which holds the circuit substrate 12. Thereby, the substrate conveyance and holding device 22 conveys the circuit substrate 12 and holds the circuit substrate 12 in a fixed manner at a predetermined position. In the following description, the conveyance direction of the circuit substrate 12 will be referred to as an X-direction, a horizontal direction which is perpendicular to the conveyance direction will be referred to as a Y-direction, and the vertical direction will be referred to as a Z-direction. In other words, the width direction of the component mounting machine 10 is the X-direction, and the front-back direction is the Y-direction.

Figure 2:
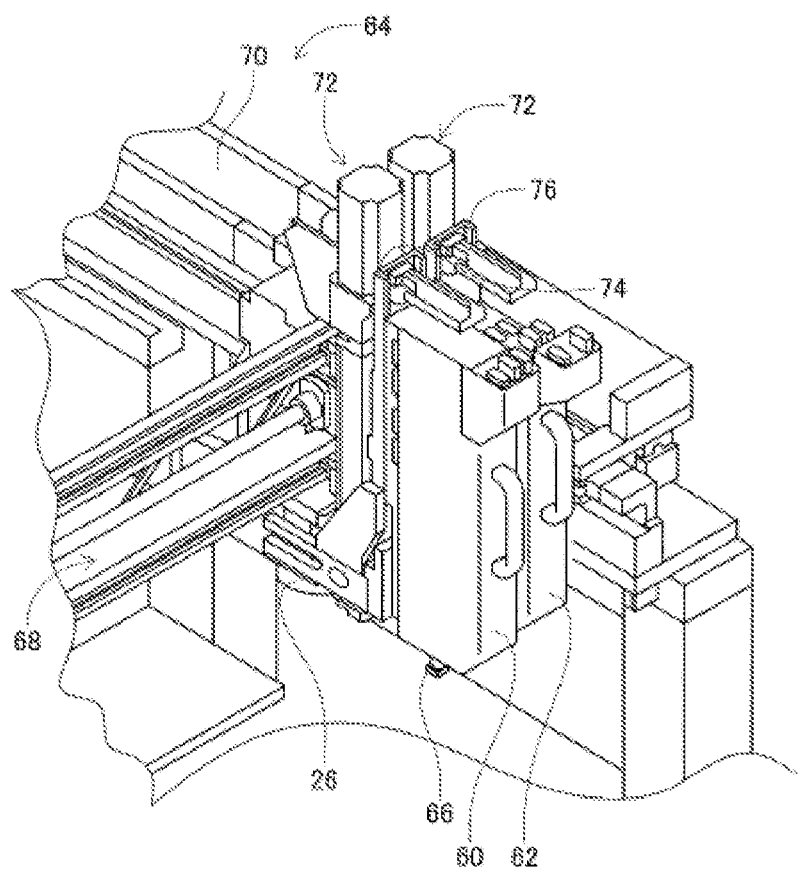
FIG. 2 is a perspective view illustrating a component mounting device of the component mounting machine.

The component mounting device 24 is arranged on the beam section 42, and includes two work heads 60 and 62, and a work head moving device 64. Each of the work heads 60 and 62 includes a suction nozzle 66 (refer to FIG. 2), and holds a component using the suction nozzle 66. The work head moving device 64 includes an X-direction moving device 68, a Y-direction moving device 70, and a Z-direction moving device 72. The two work heads 60 and 62 are caused to move integrally to an arbitrary position on the frame section 40 by the X-direction moving device 68 and the Y-direction moving device 70. As illustrated in FIG. 2, the work heads 60 and 62 are mounted to be attachable and detachable in sliders 74 and 76, respectively, and the Z-direction moving device 72 causes the sliders 74 and 76 to move in the up-down direction individually. In other words, the work heads 60 and 62 are caused to move in the up-down direction individually by the Z-direction moving device 72.

The imaging device 26 is attached to the slider 74 in a state of facing downward, and is caused to move in the X-direction, the Y-direction, and the Z-direction together with the work head 60. Accordingly, the imaging device 26 images an arbitrary position on the frame section 40. As illustrated in FIG. 1, the imaging device 28 is arranged between the substrate conveyance and holding device 22 and the component supply device 30 on the frame section 40 in a state of facing upward. Thereby, the imaging device 28 images the components that are held on the suction nozzle 66 of the work heads 60 and 62.

The component supply device 30 is arranged on an end portion of one side in the front-back direction of the frame section 40. The component supply device 30 includes a tray-type component supply device 78 and a feeder-type component supply device (not illustrated). The tray-type component supply device 78 is a device which supplies components which are in a state of being placed on a tray. The feeder-type component supply device is a device which supplies components using a tape feeder (not illustrated) and a stick feeder (not illustrated).

The bulk component supply device 32 is arranged on an end portion of the other side in the front-back direction of the frame section 40. The bulk component supply device 32 is a device which orders multiple components in a state of being dispersed loosely and supplies the components in an ordered state. In other words, a device which orders multiple components which are in arbitrary postures into predetermined postures, and supplies the components which are in the predetermined postures. Hereinafter, detailed description will be given of the configuration of the component supply device 32. Examples of the components which are supplied by the component supply device 30 and the bulk component supply device 32 include electronic circuit components, constituent components of a solar cell, constituent components of a power module, and the like. Among the electronic circuit components, there are components which include leads, components which do not include leads, and the like.

Figure 3:
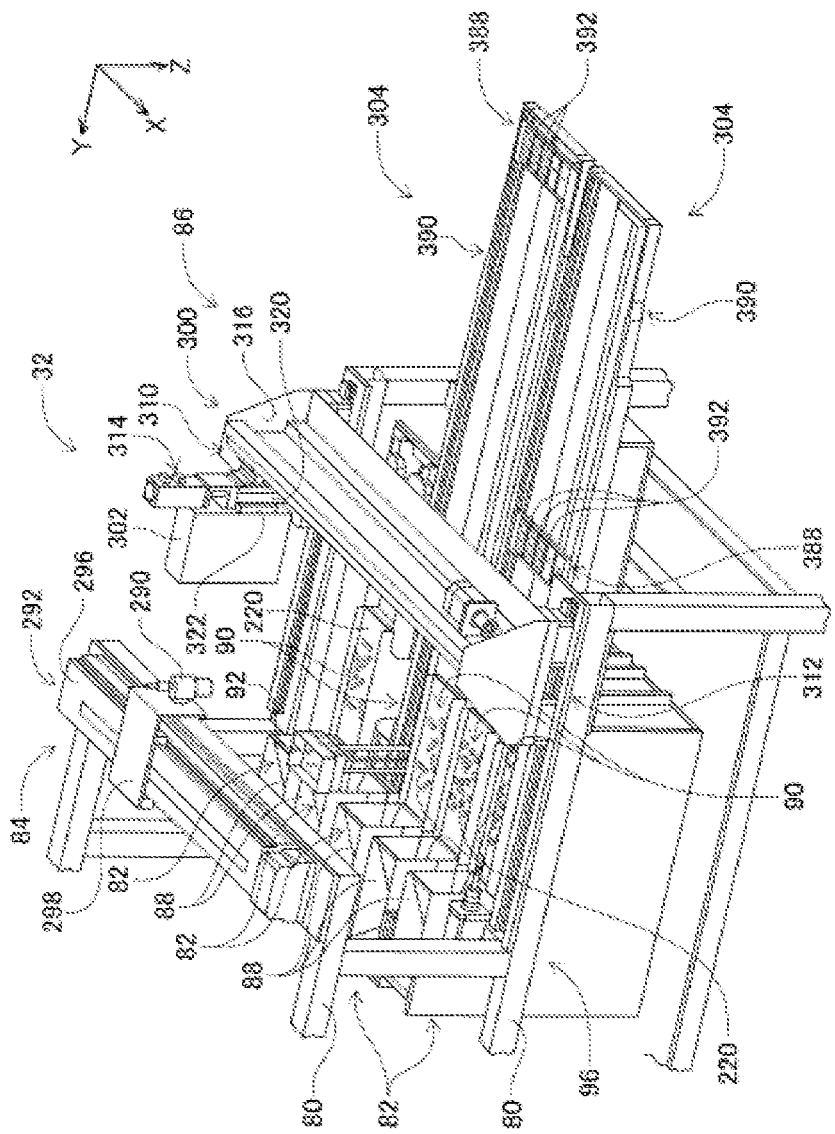
FIG. 3 is a perspective view illustrating a bulk component supply device.

As illustrated in FIG. 3, the bulk component supply device 32 includes a main body 80, a component supply unit 82, an imaging device 84, and a component delivery device 86.

(a) Component Supply Unit

The component supply unit 82 includes a component feeder 88, a component dispersed state realization device 90, and a component return device 92, and the component feeder 88, the component dispersed state realization device 90, and the component return device 92 are integrally configured. The component supply units 82 are assembled to be attachable to and detachable from a base 96 of a main body 80, and in the bulk component supply device 32, five component supply units 82 are arranged to line up in a single row in the X-direction.

(i) Component Feeder

Figure 4:
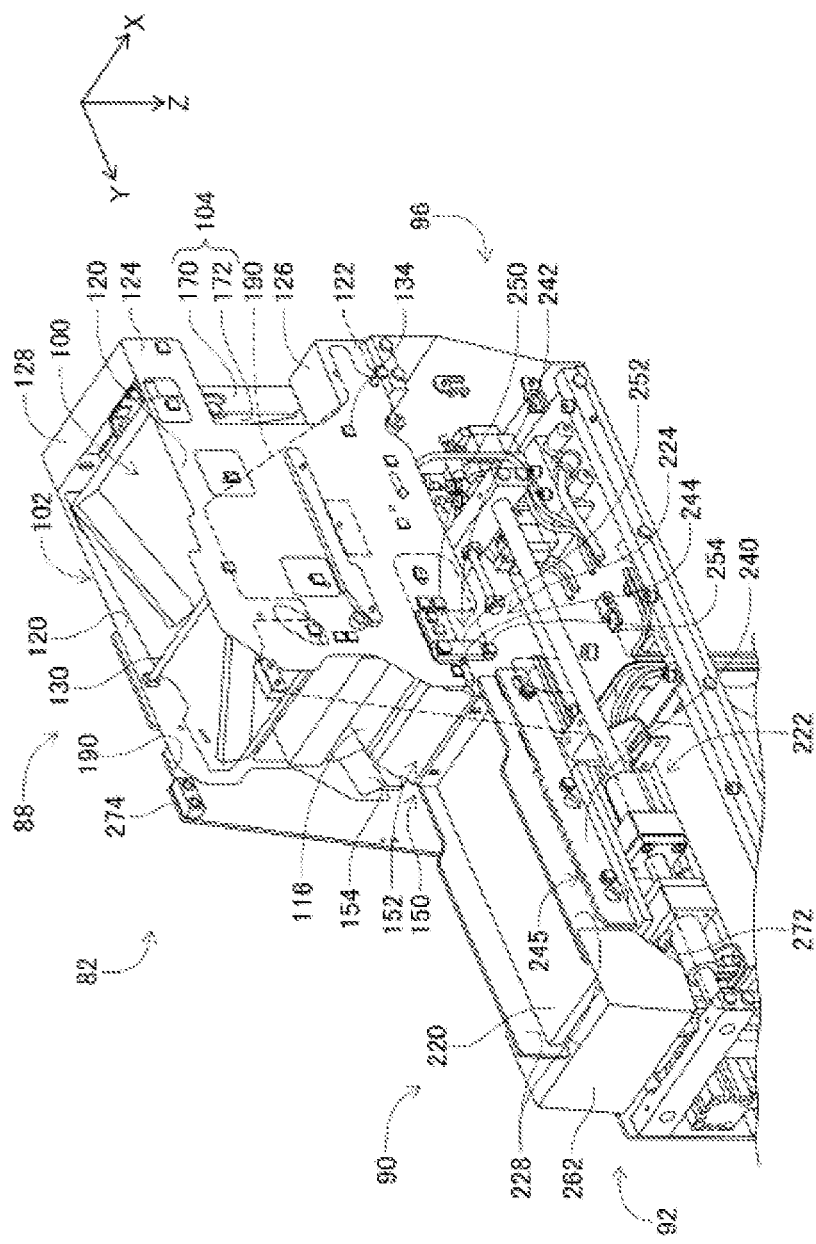
FIG. 4 is a perspective view illustrating a component supply unit.

As illustrated in FIG. 4, the component feeder 88 includes a component storage device 100, a housing 102, and a grip 104. The component storage device 100 is substantially a rectangular parallelepiped shape, and the upper face and the front face are opened. The bottom face of the component storage device 100 is an inclined surface 116, and is inclined toward the open front face of the component storage device 100.

The housing 102 has a pair of side walls 120, and the component storage device 100 is held to be rockable between the pair of side walls 120. In addition, an inclined plate 152 is arranged, in a fixed manner, between the pair of side walls 120 so as to be positioned in front of the lower end portion of the front face of the component storage device 100. The inclined plate 152 is inclined so as to reduce toward the front.

The grip 104 is arranged on the end portion on the rear side of the housing 102, and is constituted by a fixed gripping member 170 and a movable gripping member 172. The movable gripping member 172 approaches or separates with respect to the fixed gripping member 170. Then, the movable gripping member 172 is joined to the rear face of the component storage device 100 by a connecting arm (not illustrated). Thereby, the movable gripping member 172 approaches or separates from the fixed gripping member 170 by grasping the grip 104, and the component storage device 100 rocks between the pair of side walls 120.

In addition, the component feeder 88 is arranged between a pair of side frame sections 190 that are assembled on the base 96 and is attachable to and detachable from the base 96. Note that, a lock mechanism (not illustrated) is provided on a lower end portion of the movable gripping member 172 of the grip 104, and the lock mechanism is released by grasping the grip 104. That is, the component feeder 88 is removed from between the pair of side frame sections 190 by lifting the component feeder 88 in a state in which the operator grasps the grip 104 of the component feeder 88.

(ii) Component Dispersed State Realization Device

The component dispersed state realization device 90 includes a component support member 220, a component support member moving device 222, and a feeder vibration device 224. The component support member 220 is substantially in the form of a longitudinal plate and is arranged so as to extend forward from under the inclined plate 152 of the component feeder 88. In addition, aside wall section 228 is formed on both side edges of the component support member 220 in a longitudinal direction.

The component support member moving device 222 is a device that drives the component support member 220 through driving of an electromagnetic motor 223 (refer to FIG. 8) in a front-back direction. Thereby, the component support member 220 moves in the front-back direction in a state in which the upper face of the component support member 220 is horizontal, slightly below the lower end of the inclined plate 152 of the component feeder 88.

The feeder vibration device 224 includes a cam member 240, a cam follower 242, and a stopper 244. The cam member 240 is plate shaped, and is fixed to the outer side face of the side wall section 228 so as to extend in the front-back direction. Multiple teeth 245 are formed at an equal interval in the front-back direction on the upper end portion of the cam member 240. The cam follower 242 includes a lever 252 and a roller 254. The lever 252 is arranged on the lower end portion of the side wall 120 of the component feeder 88, and is swingable centered on the upper end portion. The roller 254 is rotatably held on the lower end portion of the lever 252. The lever 252 is biased to a direction toward the front by an elastic force of a coil spring (not illustrated). In addition, the stopper 244 is provided to protrude from the side wall 120, and the lever 252 which is biased by the elastic force of the coil spring is in contact with the stopper 244.

(iii) Component Return Device

Figure 5:
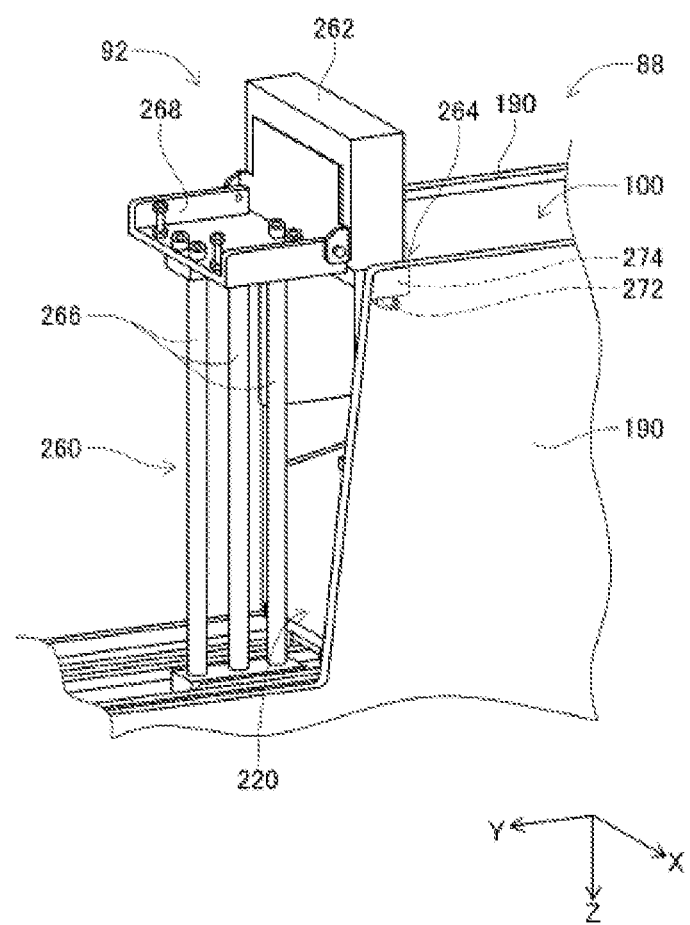
FIG. 5 is a perspective view illustrating the component supply unit in a state in which a component collecting container is lifted to a lifting end position.

As illustrated in FIG. 5, the component return device 92 includes a container lifting and lowering device 260 and a component collecting container 262. The container lifting and lowering device 260 includes an air cylinder 266 and a lifting and lowering member 268, and the lifting and lowering member 268 lifts and lowers through the operation of the air cylinder 266. In addition, the air cylinder 266 is fixed to the end portion of the front side of the component support member 220. Thereby, the air cylinder 266 moves in the front-back direction together with the component support member 220 through the operation of the component support member moving device 222.

The component collecting container 262 is arranged on the upper face of the lifting and lowering member 268 and moves in the up-down direction through the operation of the air cylinder 266. The component collecting container 262 has a box-like shape with an open upper face, and is rotatably held on the upper face of the lifting and lowering member 268. As illustrated in FIG. 4, a protruding pin 272 is arranged on an end portion on the rear side of the component collecting container 262. The protruding pin 272 protrudes toward the outside at the side of the component collecting container 262. In addition, an engaging block 274 is fixed to the inside of the upper end portion on the front side of the side frame sections 190. As illustrated in FIG. 5, the protruding pin 272 is engaged with the engaging block 274 when the component collecting container 262 is lifted to the lifting end position through the operation of the air cylinder 266. Thereby, the component collecting container 262 rotates.

(b) Imaging Device

As illustrated in FIG. 3, the imaging device 84 includes a camera 290 and a camera moving device 292. The camera moving device 292 includes a guide rail 296 and a slider 298. The guide rail 296 is fixed to the main body 80 so as to extend in the width direction of the bulk component supply device 32 above the component feeder 88. The slider 298 is attached to the guide rail 296 to be slidable, and slides to an arbitrary position through the operation of the electromagnetic motor 299 (refer to FIG. 8). The camera 290 is mounted to the slider 298 in a state of facing downward.

(c) Component Delivery Device

As illustrated in FIG. 3, the component delivery device 86 includes a component holding head moving device 300, a component holding head 302, and two shuttle devices 304.

The component holding head moving device 300 includes an X-direction moving device 310, a Y-direction moving device 312, and a Z-direction moving device 314. The Y-direction moving device 312 has a Y slider 316 that is arranged above the component supply unit 82 so as to extend in the X-direction, and the Y slider 316 moves to the arbitrary position in the Y-direction through driving of the electromagnetic motor 319 (refer to FIG. 8). The X-direction moving device 310 has an X slider 320 that is arranged on a side face of the Y slider 316, and the X slider 320 moves to the arbitrary position in the X-direction through driving of the electromagnetic motor 321 (refer to FIG. 8). The Z-direction moving device 314 has a Z slider 322 that is arranged on a side face of the X slider 320, and the Z slider 322 moves to the arbitrary position in the Z-direction through driving of the electromagnetic motor 323 (refer to FIG. 8).

Figure 6:
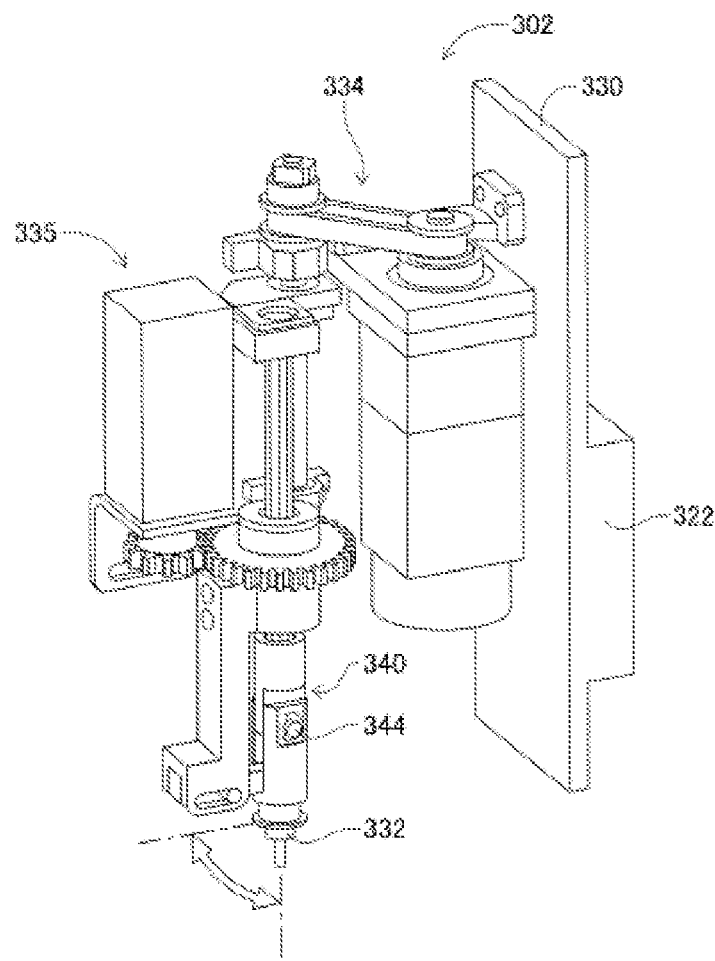
FIG. 6 is a perspective view illustrating a component holding head.

As illustrated in FIG. 6, the component holding head 302 includes a head main body 330, a suction nozzle 332, a nozzle pivoting device 334, and a nozzle rotation device 335. The head main body 330 is formed integrally with the Z slider 322. The suction nozzle 332 holds the component and is mounted to be attachable to and detachable from the lower end portion of a holder 340. The holder 340 is bendable in a support shaft 344 and is bent 90 degrees upward through the operation of the nozzle pivoting device 334. Thereby, the suction nozzle 332 that is mounted on the lower end portion of the holder 340 pivots 90 degrees and is positioned at a pivoting position. That is, the suction nozzle 332 pivots between the non-pivoting position and the pivoting position through the driving of the nozzle pivoting device 334. In addition, the nozzle rotation device 335 causes the suction nozzle 332 to rotate around the axis of the suction nozzle 332.

In addition, as illustrated in FIG. 3, each of the two shuttle devices 304 includes a component carrier 388 and a component carrier moving device 390, and the shuttle devices 304 are fixed to the main body 80 to line up in the horizontal direction on the front side of the component supply units 82. Five component receiving members 392 are mounted to the component carrier 388 in a state of being lined up in a single row in the horizontal direction, and the components are placed on each of the component receiving members 392.

Figure 7:
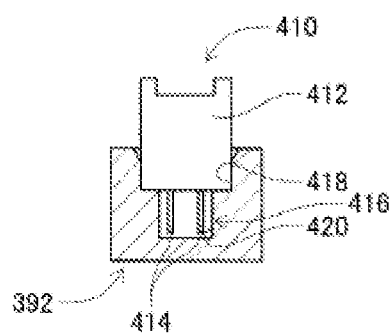
FIG. 7 is a diagram illustrating a component receiving member in a state in which the lead component is stored.

In detail, as illustrated in FIG. 7, the component which is supplied by the bulk component supply device 32 is an electronic circuit component 410 (hereinafter may be abbreviated to "lead component") which includes leads, and the lead component 410 is formed of a block-shaped component main body 412, and two leads 414 which protrude from the bottom face of the component main body 412. In addition, a component receiving recessed section 416 is formed in the component receiving member 392. The component receiving recessed section 416 is a step-shaped recessed section, and is formed of a main body section receiving recessed section 418 which is open to the upper face of the component receiving member 392, and a lead receiving recessed section 420 which is open to the bottom face of the main body section receiving recessed section 418. Then, the lead component 410 is set to a posture at which the leads 414 face downward, and is inserted inside the component receiving recessed section 416. Thereby, the lead component 410 is placed inside the component receiving recessed section 416 in a state in which the component main body 412 is inserted in the main body section receiving recessed section 418 while the leads 414 are inserted in the lead receiving recessed section 420.

In addition, as illustrated in FIG. 3, the component carrier moving device 390 is a plate shaped longitudinal member, and is arranged on the front side of the component supply unit 82 so as to extend in the front-back direction. The component carrier 388 is arranged on the upper face of the component carrier moving device 390 to be slidable in the front-back direction, and slides to an arbitrary position in the front-back direction through driving of the electromagnetic motor 430 (refer to FIG. 8). When the component carrier 388 slides in a direction approaching the component supply unit 82, the component holding head 302 slides to the component receiving position which is positioned within the movement range of the component holding head 302 due to the component holding head moving device 300. Meanwhile, when the component carrier 388 slides in a direction separating from the component supply unit 82, the component carrier 388 slides to the component supply position which is positioned within the movement range of the work heads 60 and 62 by the work head moving device 64.

Figure 8:
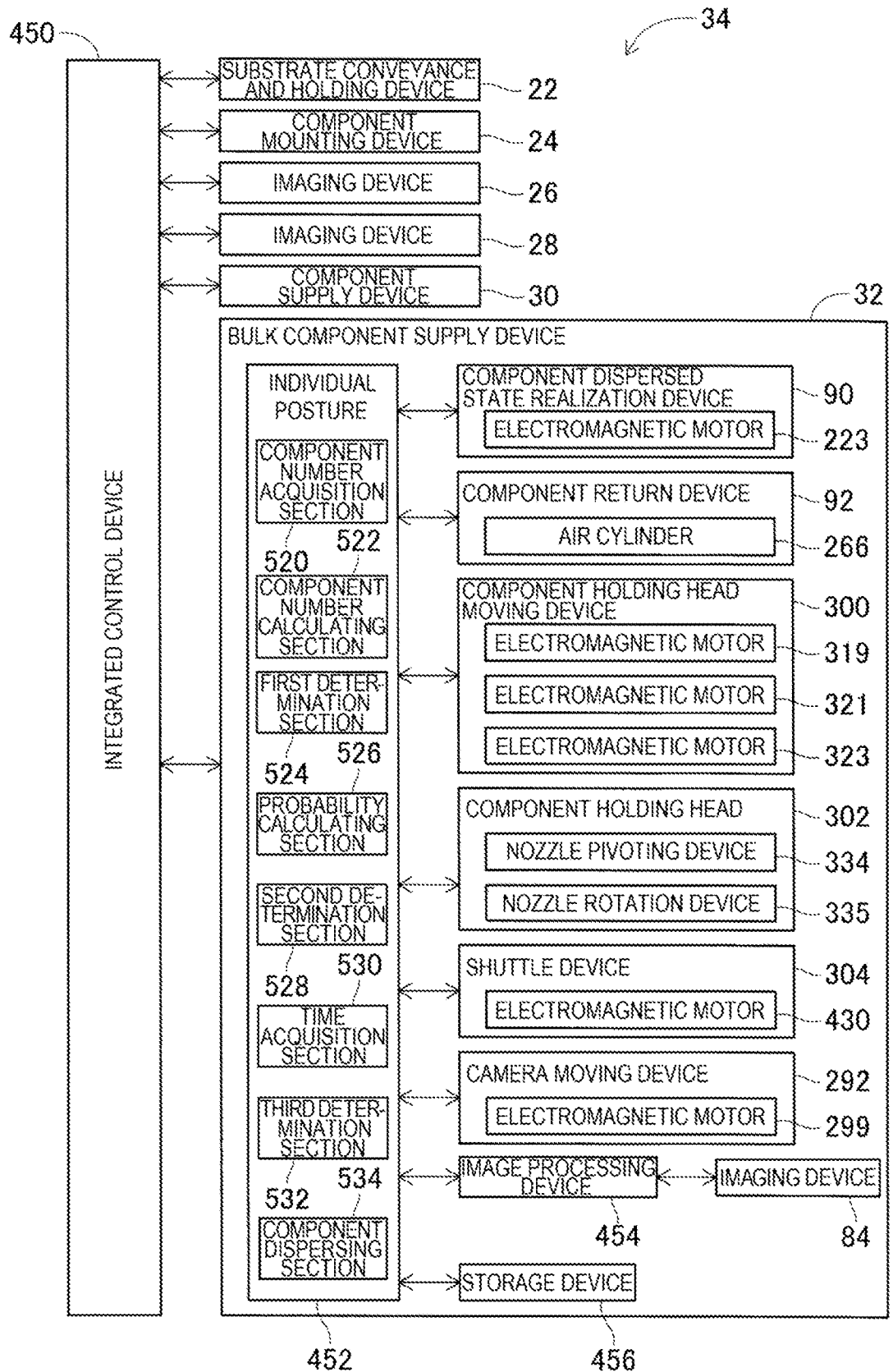
FIG. 8 is a block diagram illustrating a control device of the component mounting machine.

In addition, as illustrated in FIG. 8, the control device 34 includes an integrated control device 450, multiple individual control devices 452 (only one is illustrated in the diagram), an image processing device 454, and a storage device 456. The integrated control device 450 constitutes the main body of a computer, and connects the substrate conveyance and holding device 22, the component mounting device 24, the imaging device 26, the imaging device 28, the component supply device 30, and the bulk component supply device 32. Thereby, the integrated control device 450 integratedly controls the substrate conveyance and holding device 22, the component mounting device 24, the imaging device 26, the imaging device 28, the component supply device 30, and the bulk component supply device 32. Multiple individual control devices 452 constitute the main body of the computer, and are provided corresponding to the substrate conveyance and holding device 22, the component mounting device 24, the imaging device 26, the imaging device 28, the component supply device 30, and the bulk component supply device 32 (only the individual control device 452 that corresponds to the bulk component supply device 32 is illustrated in the diagram). The individual control devices 452 of the bulk component supply device 32 is connected to the component dispersed state realization device 90, the component return device 92, the camera moving device 292, the component holding head moving device 300, the component holding head 302, and the shuttle device 304. Thereby, the individual control devices 452 of the bulk component supply device 32 control the component dispersed state realization device 90, the component return device 92, the camera moving device 292, the component holding head moving device 300, the component holding head 302, and the shuttle device 304. In addition, the image processing device 454 is connected to the imaging device 84, and processes captured image data that is captured by the imaging device 84. The image processing device 454 is connected to the individual control devices 452 of the bulk component supply device 32. Thereby, the individual control devices 452 of the bulk component supply device 32 acquire the captured image data that is captured by the imaging device 84. In addition, the storage device 456 stores various data, and is connected to the individual control devices 452. Thereby, the individual control devices 452 acquire various data from the storage device 456.

<Operation of Component Mounting Machine>

According to the configuration described above, the component mounting machine 10 carries out work of mounting the components onto the circuit substrate 12 which is held by the substrate conveyance and holding device 22. Specifically, the circuit substrate 12 is conveyed to a working position, and is held at the position by the clamping device 52 in a fixed manner. Next, the imaging device 26 moves above the circuit substrate 12 and images the circuit substrate 12. Accordingly, information relating to the error of the holding position of the circuit substrate 12 is obtained. The component supply device 30 or the bulk component supply device 32 supplies the components at a predetermined supply position. Detailed description relating to the supplying of the components by the bulk component supply device 32 will be given later. Either of the work heads 60 and 62 moves above the supply position of the component and holds the component using the suction nozzle 66. Next, the work head 60 or 62 which holds the component moves above the imaging device 28, and the component which is held by the suction nozzle 66 is imaged by the imaging device 28. Thereby, information relating to the error of the holding position of the component is obtained. The work head 60 or 62 which holds the component moves above the circuit substrate 12, corrects the error of the holding position of the circuit substrate 12, the error of the holding position of the component, and the like, and mounts the component onto the circuit substrate 12.

<Operation of Bulk Component Supply Device>

(a) In the bulk component supply device 32 of the lead components that are supplied by the bulk component supply device, the lead components 410 are inserted into the component storage device 100 of the component feeder 88 by the operator, and the inserted lead components 410 are supplied in a state of being placed on the component receiving member 392 of the component carrier 388 through the operation of the component supply unit 82 and the component delivery device 86. In detail, the operator inserts the lead components 410 from the opening on the upper face of the component storage device 100 of the component feeder 88. At this time, the component support member 220 is moved below the component feeder 88 through the operation of the component support member moving device 222, and the component collecting container 262 is positioned in front of the component feeder 88.

The lead components 410 which are inserted from the opening on the upper face of the component storage device 100 fall on the inclined surface 116 of the component storage device 100 and spread out on the inclined surface 116. At this time, in a case in which the lead components 410 which fall onto the inclined surface 116 exceed the inclined plate 152 and roll off, the lead components 410 are accommodated in the component collecting container 262 that is positioned in front of the component feeder 88.

Figure 9:
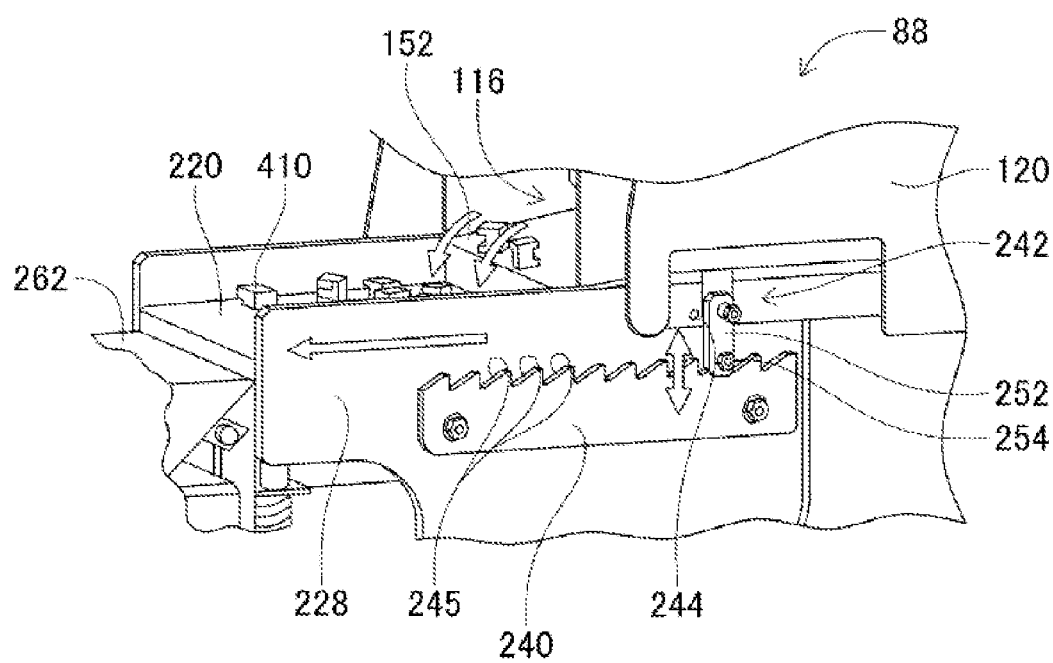
FIG. 9 is a perspective view illustrating a component dispersed state realization device.

After the insertion of the lead components 410 to the component storage device 100, the component support member 220 is caused to move from under the component feeder 88 toward the front through the operation of the component support member moving device 222. In this case, if the cam member 240 reaches the cam follower 242, as illustrated in FIG. 9, the roller 254 of the cam follower 242 exceeds the teeth 245 of the cam member 240. The lever 252 of the cam follower 242 is biased in a direction toward the front by the elastic force of a coil spring, and the biasing of the lever 252 to the front is restricted by the stopper 244. Therefore, when the component support member 220 moves toward the front, the component support member 220 is maintained in a state in which the roller 254 meshes with the teeth 245, the lever 252 does not rotate toward the front, and the roller 254 surpasses the teeth 245. In this case, the component feeder 88 is lifted due to the surpassing of the teeth 245 of the roller 254. In other words, in a state in which the roller 254 meshes with the teeth 245, the component support member 220 moves toward the front, whereby the roller 254 surpasses the multiple teeth 245, and the component feeder 88 continuously vibrates in the up-down direction.

The lead components 410 which are spread out on the inclined surface 116 of the component storage device 100 moves to the front through the vibration of the component feeder 88 and the inclination of the inclined surface 116, and are discharged onto the upper face of the component support member 220 via the inclined plate 152. In this case, the falling of the lead components 410 from the component support member 220 is prevented by the side wall section 228 of the component support member 220. Then, the lead components 410 are dispersed on the upper face of the component support member 220 by moving the component support member 220 toward the front.

Figure 10:
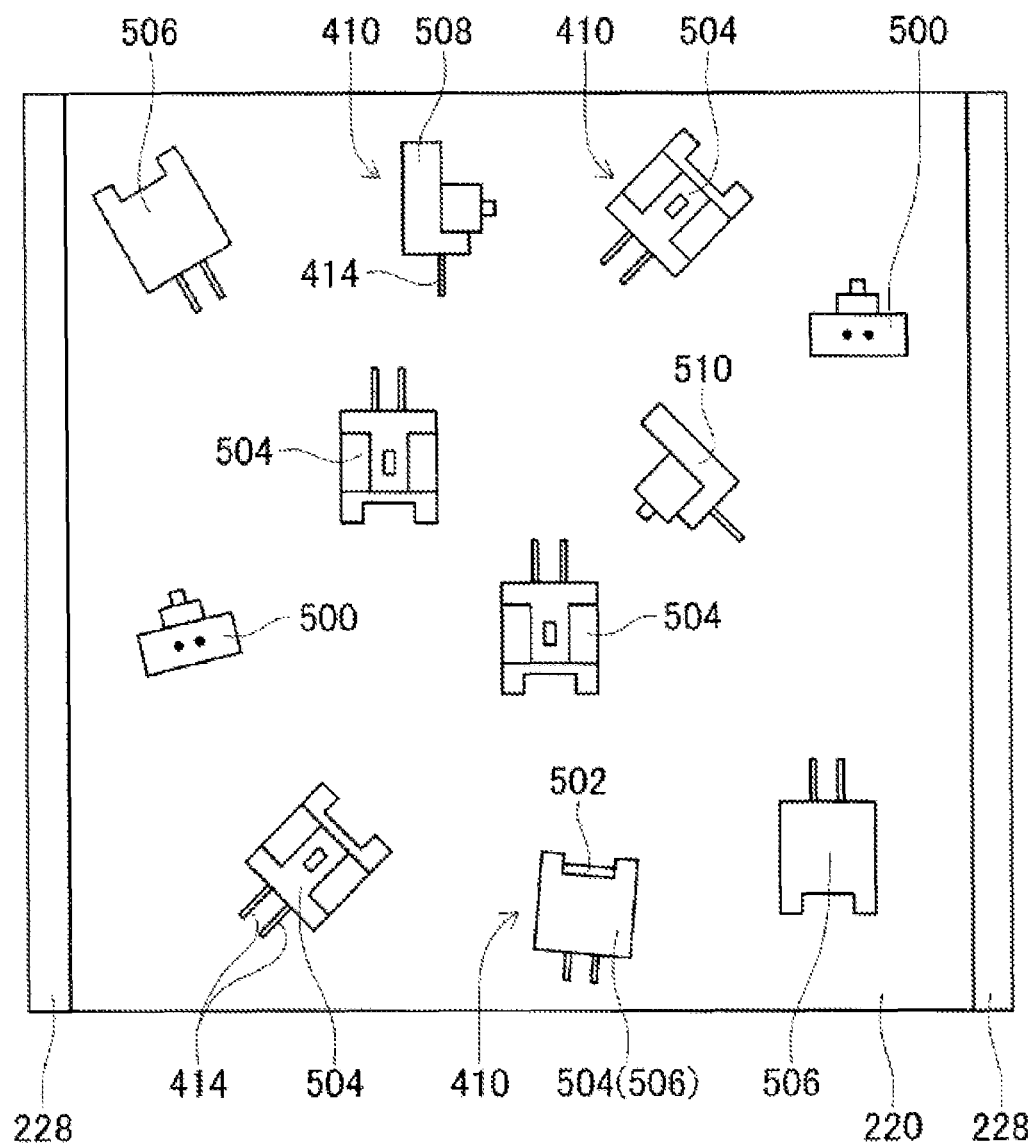
FIG. 10 is a diagram illustrating a component support member in a state in which multiple lead components are dispersed.

Note that, as illustrated in FIG. 10, the lead components 410 are dispersed on the component support member 220 in various postures when the lead components 410 are dispersed from the inside of the component storage device 100 on the component support member 220. Specifically, the component main body 412 of the lead components 410 is substantially a rectangular parallelepiped shape, and has six faces. The six faces are the bottom face 500 out of which the leads 414 extend, an upper face 502 that is the rear side of the bottom face 500, and four side faces 504, 506, 508, and 510. Then, the four side faces 504, 506, 508, and 510 have a large surface area, and are a first side face 504 on which many concavities and convexities are present, a second side face 506 that is the rear side of the first side face 504 and has no concavities and convexities, a third side face 508 that is a side horizontal to the first side face 504 and the second side face 506, and a fourth side face 510.

The lead components 410 are supported on the component support member 220 at roughly five postures when such lead components 410 are dispersed on the component support member 220. In detail, the lead components 410 are supported on the component support member 220 at any posture out of the six postures of a posture in which the first side face 504 faces straight up (hereinafter, described as a "first posture"), a posture in which the second side face 506 faces straight up (hereinafter, described as a "second posture"), a posture in which the third side face 508 or the fourth side face 510 faces straight up (hereinafter, described as a "third posture"), a posture in which the bottom face 500 faces straight up (hereinafter, described as a "fourth posture"), and a posture in which the first side face 504 or the second side face 506 faces diagonally up (hereinafter, described as a "fifth posture"). Note that, in the lead component 410 of the fifth posture, the first side face 504 or the second side face 506 face diagonally up due to the distal end of the lead component 410 contacting the component support member 220.

As described above, when the lead components 410 are dispersed on the component support member 220 at various postures, the camera 290 of the imaging device 84 is caused to move above the component support member 220 through the operation of the camera moving device 292, and the camera 290 images the lead components 410. Then, the lead components that are pickup targets (hereinafter, referred to as "pickup target components") based on the captured image data that is captured by the camera 290 are held by the suction nozzle 332 of the component holding head 302.

Specifically, the component posture and component position are calculated for each of the multiple components that are dispersed on the component support member 220 based on the captured image data of the camera 290. Then, only the lead components 410 with the calculated component posture that is the second posture and the third posture are specified as the pickup target components. Thereby, in the lead components 410 with the first posture, the first side face 504 on which there are many concavities and convexities faces upward, and it is not possible to hold the first side face 504 by the suction nozzle 332. Thereby, in the lead components 410 with the fourth posture, the bottom face 500 on which the leads 414 are arranged faces upward, and it is not possible to hold the bottom face 500 by the suction nozzle 332. In addition, in the lead components 410 with the fifth posture, the component main body 412 is in an inclined state, and it is not possible to hold the posture of the lead component 410 by the suction nozzle 332.

Therefore, in the component support member 220 that is illustrated in FIG. 10, four lead components 410 out of 11 lead components 410 that are dispersed on the component support member 220 are specified as the pickup target components. Specifically, two lead components 410 with the second posture and two lead components 410 with the third posture are specified as the pickup target components. Note that, when the lead components 410 are dispersed on the component support member 220, out of the lead components 410 that are dispersed on the component support member 220, a probability of the lead components 410 that are specified as the pickup target component being present, that is, a probability of being holdable by the suction nozzle 332 (hereinafter, described as "holding probability") is calculated.

Specifically, the total number (11) of the lead components 410 that are dispersed on the component support member 220 is calculated based on the captured image data of the component support member 220 by the camera 290. Then, a ratio of the number (four) of the pickup target components with respect to the number (11) of the lead components 410 is calculated as the holding probability. The calculated holding probability is stored in the storage device 456 in each component that is supplied by the bulk component supply device 32. Note that, the holding probability is used during return work of the component that is described later in detail.

Then, when the pickup target components are specified, the pickup target components are held by the suction nozzle 332 of the component holding head 302. When the pickup target component is sucked and held by the suction nozzle 332, the suction nozzle 332 is positioned at the non-pivoting position. Then, after the lead components 410 are held by the suction nozzle 332, the component holding head 302 is caused to move above the component carrier 388. At this time, the component carrier 388 moves to the component receiving position through the operation of the component carrier moving device 390. When the component holding head 302 moves above the component carrier 388, the suction nozzle 332 is caused to pivot to the pivoting position. Note that, the suction nozzle 332 rotates through the operation of the nozzle rotation device 335 such that the leads 414 of the lead component 410 which is held by the suction nozzle 332 at the pivoting position faces downward in the vertical direction.

When the component holding head 302 is caused to move above the component carrier 388, the lead component 410 which is in a state in which the leads 414 face downward in the vertical direction is inserted into the component receiving recessed section 416 of the component receiving member 392. Thereby, as illustrated in FIG. 7, the lead components 410 are placed on the component receiving member 392 in a state in which the leads 414 face downward in the vertical direction.

Then, when the lead components 410 are placed on the component receiving member 392, the component carrier 388 moves to the component supply position through the operation of the component carrier moving device 390. Since the component carrier 388 which is moved to the component supply position is positioned in the movement range of the work heads 60 and 62, the lead component 410 is supplied at this position in the bulk component supply device 32. In this manner, in the bulk component supply device 32, the lead component 410 is supplied in a state in which the leads 414 face downward, and the upper face 502 that faces the bottom face 500 to which the leads 414 are connected faces upward. Therefore, the suction nozzle 66 of the work heads 60 and 62 becomes capable of appropriately holding the lead components 410.

(b) Collection of Lead Components

Figure 11:
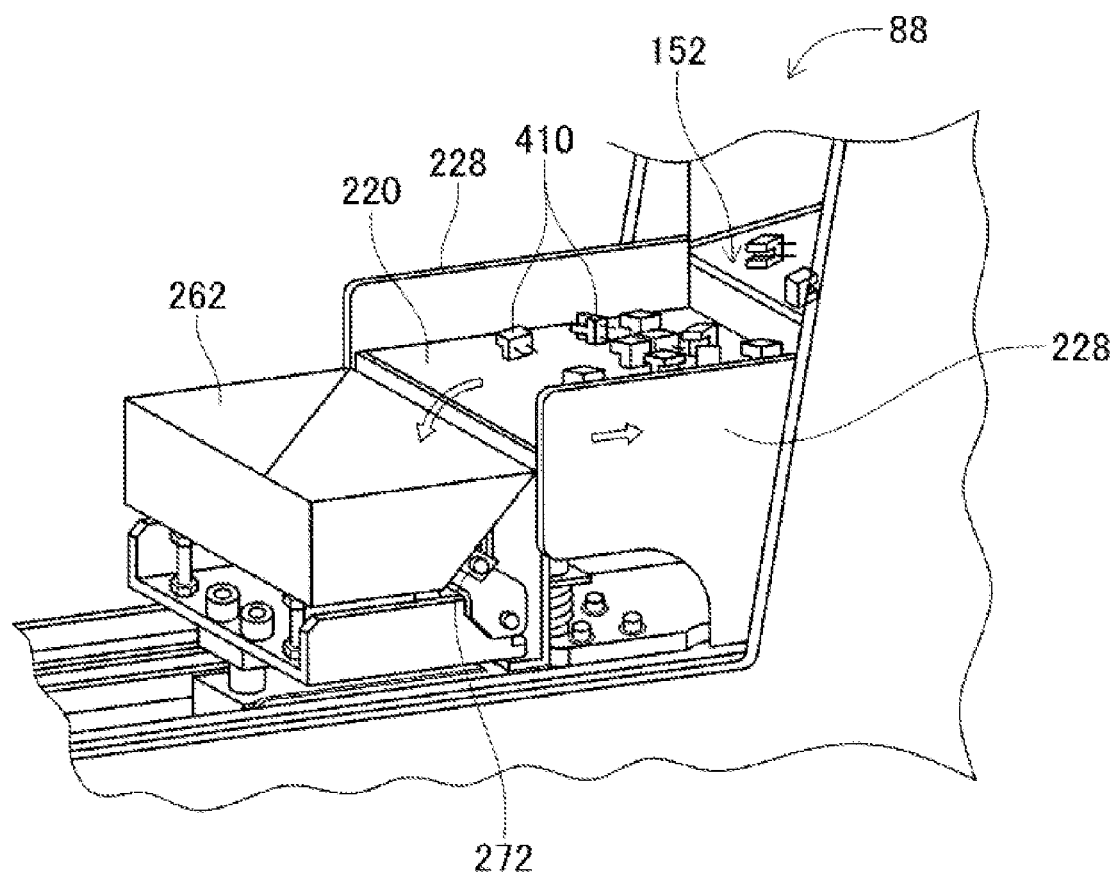
FIG. 11 is a perspective view illustrating the component dispersed state realization device and the component return device.

In addition, in the bulk component supply device 32, it is possible to collect the lead components 410 that are dispersed on the component support member 220. Specifically, the component support member 220 is caused to move below the component feeder 88 through the operation of the component support member moving device 222. In this case, as illustrated in FIG. 11, the lead components 410 on the component support member 220 are blocked by the inclined plate 152 of the component feeder 88, and the lead components 410 on the component support member 220 are scraped off the inside of the component collecting container 262.

Next, the component collecting container 262 is lifted by the operation of the container lifting and lowering device 260. At this time, as illustrated in FIG. 5, the protruding pin 272 which is arranged on the component collecting container 262 engages with the engaging block 274 which is arranged on the inside of the side frame sections 190. Thereby, the component collecting container 262 rotates, and the lead components 410 inside the component collecting container 262 are returned to the inner portion of the component storage device 100.

Then, as described above, by grasping the grip 104 of the component feeder 88, the operator releases locking of the component feeder 88 and the component feeder 88 is removed from between the pair of side frame sections 190 by lifting the component feeder 88. Thereby, the lead components 410 are collected from the component feeder 88 outside of the bulk component supply device 32.

(c) Resupply of Lead Components

In addition, in the bulk component supply device 32, the lead components 410 that are returned from the component support member 220 to the component storage device 100 may be redispersed on the component support member 220 without being collected from the component storage device 100, and according to the procedure described above, the lead components 410 may be resupplied by placing on the component receiving member 392.

Specifically, as described above, only the lead components 410 with the second posture and the third posture out of the lead components 410 that are dispersed on the component support member 220 are transferred to the component receiving member 392 and the lead components 410 with other postures are caused to remain on the component support member 220. Therefore, when all of the lead components 410 with the second posture and the third posture are transferred from the component support member 220 to the component receiving member 392, only the lead components 410 with a nontransferable posture remain in the component support member 220, and the bulk component supply device 32 is not able to supply the lead components 410. In this manner, in a case where only the lead components 410 with the nontransferable posture remain on the component support member 220, the remaining lead components 410 are returned from the component support member 220 to the component storage device 100, and are redispersed from the component storage device 100 on the component support member 220. At this time, the lead components 410 that are in various postures of the first to fifth postures are dispersed on the component support member 220. Thereby, it is possible to retransfer the lead components 410 with the second posture and the third posture from the component support member 220 to the component receiving member 392.

In addition, not only in a case where only the lead components 410 with the nontransferable posture remain on the component support member 220, but also when the lead components 410 with the transferable posture remain on the component support member 220, the remaining lead components 410 may be returned from the component support member 220 to the component storage device 100, and may be redispersed from the component storage device 100 on the component support member 220.

In detail, during mounting work by the component mounting machine 10, the number of necessary lead components 410 (hereinafter, described as the "necessary number of components") in the mounting work is transferred from the integrated control device 450 to the individual control device 452 of the bulk component supply device 32. Then, in the individual control device 452 to which the necessary number of components are transferred, the number of suppliable lead components 410 is calculated. That is, the component support member 220 on which the lead components 410 are dispersed is imaged by the camera 290, and the number of lead components 410 that are holdable by the suction nozzle 332 (hereinafter, described as the "number of holdable components"), that is, the number of lead components 410 with the second posture and the third posture is calculated based on the captured image data.

Then, it is determined in the individual control device 452 whether or not the necessary number of components exceeds the number of holdable components. That is, it is determined whether or not it is possible to supply the lead components 410 of the necessary number of components from the component support member 220. At this time, in a case where the necessary number of components does not exceed the number of holdable components, that is, it is determined that it is possible to supply the lead components 410 of the necessary number of components from the component support member 220, according to the procedure described above, the lead components 410 of the necessary number of components is transferred and supplied from the component support member 220 to the component receiving member 392. Specifically, as illustrated in FIG. 10, for example, in a case where the number of holdable components is four, if the necessary number of components is three, according to the procedure described above, three lead components 410 are sequentially transferred and supplied to the component receiving member 392.

Meanwhile, in a case where the necessary number of components exceeds the number of holdable components, that is, it is determined that it is not possible to supply the lead components 410 of the necessary number of components from the component support member 220, the components from the component support member 220 return to the component storage device 100, and it is necessary to disperse the components from the component storage device 100 on the component support member 220, but a certain amount of time is necessary in return work to the component storage device 100 and the dispersal work of the component support member 220. Therefore, a performance timing of the return work to the component storage device 100 and the dispersal work of the component support member 220 are determined according to a progress state of the mounting work by the component mounting machine 10, a work condition of the component carrier 388, and the like.

In detail, the progress state of the mounting work by the component mounting machine 10 is managed in the integrated control device 450. Therefore, in the individual control device 452 of the bulk component supply device 32, when it is determined that the necessary number of components exceeds the number of holdable components, the individual control device 452 carries out an inquiry of the progress state of the mounting work by the component mounting machine 10 in the integrated control device 450 and the remaining time until the mounting work of the components that are supplied from the bulk component supply device 32 is performed (hereinafter, described as "remaining time") is acquired from the integrated control device 450. That is, the individual control device 452 acquires, as the remaining time, from the integrated control device 450 a time from an inquiry time from the individual control device 452 to the integrated control device 450 until a prearranged start time of the mounting work using the components that are supplied from the bulk component supply device 32.

In addition, in a case where in the individual control device 452, the component carrier 388 is not positioned at the component receiving position, the necessary time until the component carrier 388 moves to the component receiving position (hereinafter, described as " necessary time") is acquired. Thereby, for example, when the component carrier 388 supplies the components in the component supply position, a certain amount of time is necessary as a time in which the component carrier 388 moves up to the component receiving position since it is not possible to move the component carrier 388 from the component supply position. Note that, the necessary time is calculated by the individual control device 452 since the operation of the component carrier 388 is controlled by the individual control device 452.

When acquiring the remaining time and the necessary time, the individual control device 452 determines whether or not the remaining time and the necessary time exceed a threshold time. Note that, the threshold time is set to a certain time that is necessary in the return work to the component storage device 100 and the dispersal work of the component support member 220. Then, in a case of determining that the remaining time and necessary time do not exceed the threshold time, the individual control device 452 performs the return work to the component storage device 100 and the dispersal work of the component support member 220 after the lead components 410 that are transferable from the component support member 220 are all transferred to the component receiving member 392. Then, the components that are redispersed on the component support member 220 are transferred to the component receiving member 392.

Specifically, as illustrated in FIG. 10, for example, in a case where the number of holdable components is four, if the necessary number of components is six, first, four lead components 410 are sequentially transferred and supplied to the component support member 220. Next, the lead components 410 are returned from the component support member 220 to the component storage device 100, and are redispersed from the component storage device 100 on the component support member 220. Then, two lead components 410 from the component support member 220 are sequentially transferred and supplied to the component support member 220. Thereby, the lead components 410 of the necessary number of components are supplied by the bulk component supply device 32.

Meanwhile, in a case of determining that at least one of the remaining time and the necessary time exceed the threshold time, the individual control device 452 returns the lead components 410 from the component support member 220 to the component storage device 100 without performing transfer work of the lead components 410 from the component support member 220, and redisperses the lead components 410 from the component storage device 100 on the component support member 220. Then, the lead components 410 of the necessary number of components are transferred to the component receiving member 392 from the components that are redispersed on the component support member 220.

Specifically, as illustrated in FIG. 10, for example, in a case where the number of holdable components is four, if the necessary number of components is six, the individual control device 452 returns the lead components 410 from the component support member 220 to the component storage device 100 without transferring the lead components 410 from the component support member 220, and redisperses the lead components 410 from the component storage device 100 on the component support member 220. At this time, for example, the component carrier 388 that is moved to the component supply position moves to the component receiving position. Then, six lead components 410 from the components that are redispersed on the component support member 220 are sequentially transferred and supplied to the component support member 220. At this time, the component mounting machine 10 performs other mounting work, and supplies the lead components 410 utilizing the time of the mounting work.

In this manner, in the bulk component supply device 32, the return work to the component storage device 100 and the dispersal work of the component support member 220 are performed utilizing free time until the mounting work in which the components that are supplied by the bulk component supply device 32 are used and free time until the component carrier 388 moves to the component receiving position. Thereby, it is possible to supply the lead components 410 of the necessary number of components without stopping the mounting work by the component mounting machine 10 and it is possible to improve the cycle time.

However, there is a concern that the cycle time worsens even if the return work to the component storage device 100 and the dispersal work of the component support member 220 are performed utilizing free time of the mounting work by the component mounting machine 10, free time until the component carrier 388 moves to the component receiving position, and the like. That is, according to the shape of the lead components 410, the holding probability may be equivalently low, and in such a case, there is a concern that even if the return work to the component storage device 100 and the dispersal work of the component support member 220 are performed, the number of holdable lead components 410 from the component support member 220 does not reach the necessary number of components or more.

Specifically, as illustrated in FIG. 10, for example, in a case where the number of holdable components is four, if the necessary number of components is six, when determining that at least one of the remaining time and the necessary time exceed the threshold time, the return work to the component storage device 100 and the dispersal work of the component support member 220 are performed without transferring the lead components 410 from the component support member 220. At this time, if the holding probability of the lead components 410 is approximately 20%, even if the lead components 410 from the component support member 220 are returned to the component storage device 100 and redispersed from the component storage device 100 on the component support member 220, there is a high possibility that the number of holdable components is two to three (11 (total number of lead components 410 on the component support member 220)×20%), and it is not possible to supply six lead components 410. In such a case, there is a concern that it is necessary to carry out again return work to the component storage device 100 and dispersal work of the component support member 220, and the cycle time worsens.

Therefore, in the bulk component supply device 32, it is determined whether or not the holding probability exceeds the threshold in a case where at least one of the remaining time and the necessary time exceed the threshold time. Then, in a case of determining that the holding probability does not exceed the threshold in the same manner as in a case of determining that the remaining time and necessary time do not exceed the threshold time, the individual control device 452 performs the return work to the component storage device 100 and the dispersal work of the component support member 220 after the lead components 410 that are transferable from the component support member 220 are all transferred to the component receiving member 392. Then, the components that are redispersed on the component support member 220 are transferred to the component receiving member 392.

Meanwhile, in a case of determining that the holding probability exceeds the threshold, as described above, the individual control device 452 performs the return work to the component storage device 100 and the dispersal work of the component support member 220 without carrying out transfer work of the lead components 410 from the component support member 220, and the lead components 410 of the necessary number of components are supplied from the redispersed components. That is, in a case where three conditions are satisfied of the necessary number of components exceeding the holdable component number, at least one of the necessary time and the remaining time exceeding the threshold time, and the holding probability exceeding the threshold, the return work to the component storage device 100 and the dispersal work of the component support member 220 are performed utilizing the free time. Thereby, it is possible to reliably improve the cycle time.

Note that, as described above, the holding probability is calculated for each component that is dispersed on the component support member 220 and is stored in the storage device 456 in each component. Therefore, the holding probability is a value close to an actual probability since the components are reformed for each dispersal on the component support member 220. In addition, the threshold of the holding probability is varied according to the necessary number of components, the holding probability, and the like.

<Control Program>

Figure 12:
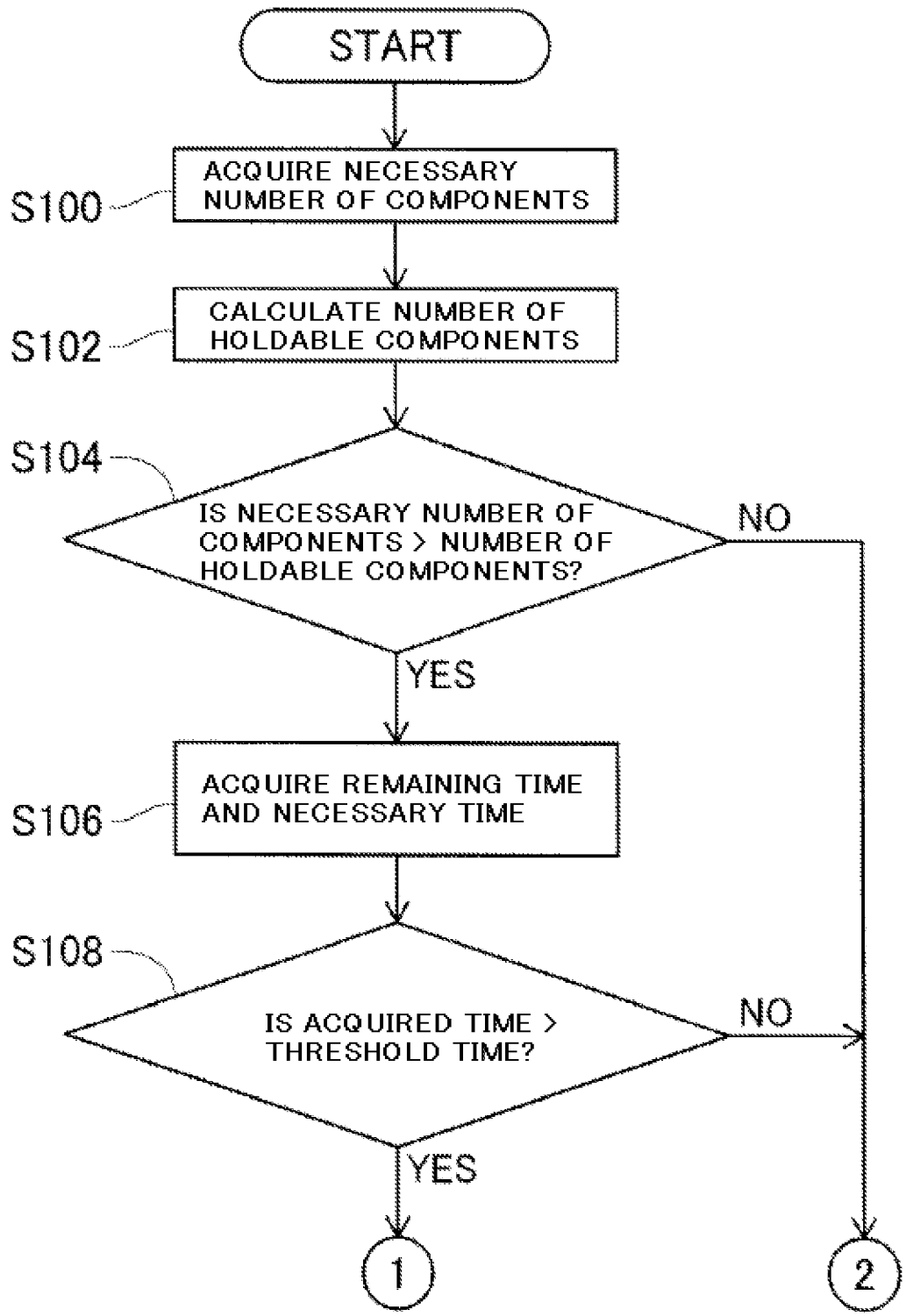
FIG. 12 is a diagram illustrating a flowchart of a control program.
Figure 13:
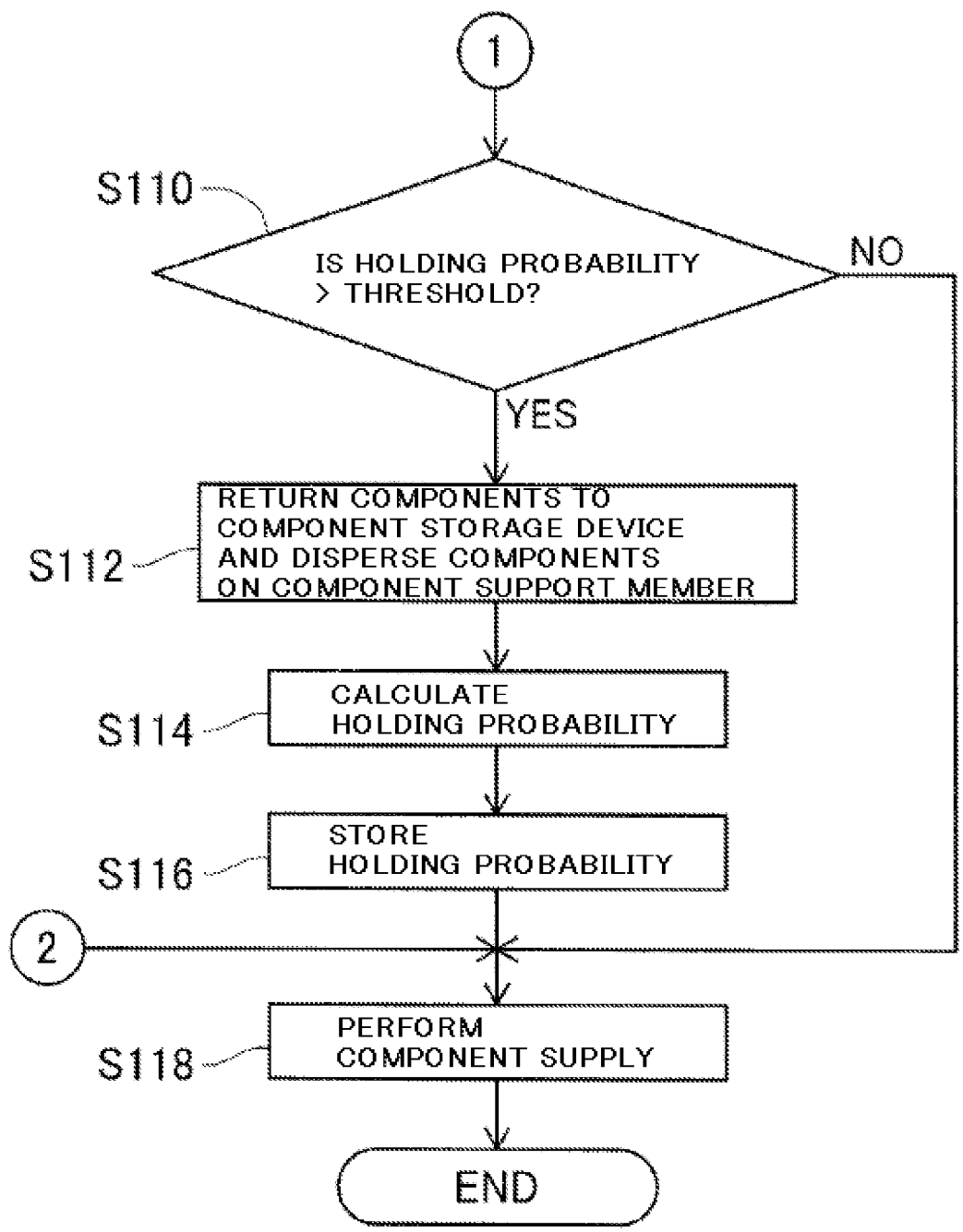
FIG. 13 is a diagram illustrating a flowchart of a control program.

Component supply work of the bulk component supply device 32 described above is carried out by performing a control program in the individual control device 452. A flow when the control program is performed will be described below using FIG. 12 and FIG. 13.

First, in the control program, the individual control device 452 acquires the necessary number of components from the integrated control device 450 (S100). Next, the individual control device 452 calculates the number of holdable components (S102). Then, the individual control device 452 determines whether or not the necessary number of components exceeds the number of holdable components (S104). In a case where it is determined that the necessary number of components exceeds the number of holdable components (YES in S104), the individual control device 452 acquires the remaining time and the necessary time (S106).

Next, the individual control device 452 determines whether or not at least one of the acquired remaining time and the necessary time exceed a threshold time (S108). In a case where at least one of the remaining time and the necessary time exceed the threshold time (YES in S108), the individual control device 452 determines whether or not the holding probability exceeds the threshold (S110). In a case of determining that the holding probability exceeds the threshold (YES in S110), the individual control device 452 performs the return work to the component storage device 100 and the dispersal work of the component support member 220 (S112).

Next, the component support member 220 on which the components are dispersed is imaged by the camera 290, and the individual control device 452 calculates the holding probability based on the captured image data (S114). Then, the calculated holding probability is stored in the storage device 456 in each component (S116). Next, the pickup target components from the component support member 220 are held by the suction nozzle 332, and the lead components 410 are supplied by moving to the component receiving member 392 (S118). Thereby, performance of the control program ends.

In addition, in a case where it is determined that the necessary number of components does not exceed the number of holdable components in S104 (NO in S104), in a case where it is determined that at least one of the remaining time and the necessary time do not exceed the threshold time in S108 (NO in S108), and in a case where it is determined that the holding probability does not exceed the threshold in S110 (NO in S110), the process in 5118 is performed and the control program ends.

Note that, as illustrated in FIG. 8, the individual control device 452 performs the control program, and has a component number acquisition section 520, a component number calculating section 522, a first determination section 524, a probability calculating section 526, a second determination section 528, a time acquisition section 530, a third determination section 532, and a component dispersing section 534. The component number acquisition section 520 is a functional section for performing the process of 5100 of the control program, that is, a process for acquiring the necessary number of components from the integrated control device 450. The component number calculating section 522 is a functional section for performing the process of 5102 of the control program, that is, a process for calculating the number of the holdable components. The first determination section 524 is a functional section for performing the process of S104 of the control program, that is, a process for determining whether or not the necessary number of components exceeds the number of holdable components. The probability calculating section 526 is a functional section for performing the process of S114 of the control program, that is, a process for calculating the holding probability. The second determination section 528 is a functional section for performing the process of S110 of the control program, that is, a process for determining whether or not the holding probability exceeds the threshold. The time acquisition section 530 is a functional section for performing the process of S106 of the control program, that is, a process for acquiring the remaining time and the necessary time. The third determination section 532 is a functional section for performing the process of S108 of the control program, that is, a process for determining whether or not at least one of the remaining time and necessary time exceeds the threshold time. The component dispersing section 534 is a functional section for performing the process of S112 of the control program, that is, a process for performing return work to the component storage device 100 and the dispersal work of the component support member 220.

In addition, the present disclosure is not limited to the applied example described above, and it is possible to carry out the present disclosure in various aspects subjected to various modifications and improvements based on the knowledge of a person skilled in the art. Specifically, for example, in the applied example, in a case where three conditions are satisfied of the necessary number of components exceeding the holdable component number, at least one of the necessary time and the remaining time exceeding the threshold time, and the holding probability exceeding the threshold, the return work and the like to the component storage device 100 in which the free time is utilized is performed, and at least in a case where a condition is satisfied in which the necessary number of components exceeds the number of holdable components, the return work and the like to the component storage device 100 in which the free time is utilized is performed. That is, it is possible to arbitrary set two conditions of at least one of the necessary time and the remaining time exceeding the threshold time, and the holding probability exceeding the threshold.

In addition, in the applied example, the present disclosure is applied to the lead components 410 that have the leads 414, but it is possible to apply the present disclosure to various types of components. Specifically, for example, it is possible to apply the present disclosure to a configuration component of a solar cell, a configuration component of a power module, an electronic circuit component that does not have a lead, and the like.

REFERENCE SIGNS LIST

10: COMPONENT MOUNTING MACHINE (MOUNTING WORK MACHINE), 24: COMPONENT MOUNTING DEVICE, 66: SUCTION NOZZLE (SECOND COMPONENT HOLDING TOOL), 32: BULK COMPONENT SUPPLY DEVICE (COMPONENT SUPPLY DEVICE), 84: IMAGING DEVICE, 92: COMPONENT RETURN DEVICE, 100: COMPONENT STORAGE DEVICE, 220: COMPONENT SUPPORT MEMBER (COMPONENT SUPPORT SECTION), 332: SUCTION NOZZLE (FIRST COMPONENT HOLDING TOOL), 392: COMPONENT RECEIVING MEMBER (PLACEMENT SECTION), 452: INDIVIDUAL CONTROL DEVICE (CONTROL DEVICE), 456: STORAGE DEVICE, 520: COMPONENT NUMBER ACQUISITION SECTION, 522: COMPONENT NUMBER CALCULATING SECTION, 524: FIRST DETERMINATION SECTION, 526: PROBABILITY CALCULATING SECTION, 528: SECOND DETERMINATION SECTION, 530: TIME ACQUISITION SECTION, 532: THIRD DETERMINATION SECTION, 534: COMPONENT DISPERSING SECTION

The invention claimed is:

1. A component supply device which is related to mounting work of components on a board, the component supply device comprising:
    a component storage device that stores a plurality of components,
    a component support section that supports the components in a dispersed state in which the components are dispersed from the component storage device, a feeder vibration device that vibrates the component support section, a first component holding tool that holds the components that are supported in the component support section, an imaging device that images the components that are supported in the component support section in a state that the feeder vibration device does not vibrate the component support section, and a control device, the component supply device supplying the components so as to mount the components on the board, wherein the control device includes a component number acquisition section that acquires a necessary number of components that is a number of components that are necessary during mounting work in the mounting work machine, a component number calculating section that calculates a number of holdable components that is a number of components that are holdable from the component support section by the first component holding tool based on captured image data that is captured by the imaging device, and a first determination section that determines whether or not the necessary number of components that is acquired by the component number acquisition section exceeds the number of holdable components that are calculated by the component number calculating section.

2. The component supply device according to claim 1, wherein each of the components includes a bottom face, an upper face, a first side face, a second side face, a third side face, and a fourth side face, and wherein only the components with a calculated component posture in which the second side face, the third side face, or the fourth side face faces straight up are specified as the pickup target components.

3. The component supply device according to claim 1, wherein a side wall section is formed on both side edges of the component support section in a longitudinal direction.

4. The component supply device according to claim 1, further comprising a bulk component supply device which orders the components from arbitrary postures into predetermined postures and supplies the components which are in the predetermined postures, wherein the bulk component supply device includes a main body and component supply units which are assembled to be attachable to and detachable from a base of the main body, the component supply units being arranged to line up in a single row in a conveyance direction.

5. A method for performing mounting work of components on a board, the method comprising:

storing a plurality of components;

supporting the components in a component support section in a dispersed state in which the components are dispersed;

vibrating the component support section;

holding the components that are supported in a first component holding tool;

imaging the supported components in a state in which the component support section is not vibrated;

acquiring a necessary number of components that is a number of components that are necessary during the mounting work in a mounting work machine;

calculating a number of holdable components that is a number of components that are holdable from the component support section by the first component holding tool based on captured image data; and determining whether or not the necessary number of components exceeds the number of holdable components.

* * * * *